(12) United States Patent
Nakashima et al.

(10) Patent No.: US 8,661,973 B2
(45) Date of Patent: Mar. 4, 2014

(54) SCREEN PLATE INCLUDING DUMMY PRINTING REGION AND FULL SURFACE SOLID PRINTING REGION

(75) Inventors: Makito Nakashima, Kanagawa (JP); Akishige Murakami, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 445 days.

(21) Appl. No.: 13/003,104

(22) PCT Filed: Jul. 14, 2009

(86) PCT No.: PCT/JP2009/063016
§ 371 (c)(1),
(2), (4) Date: Jan. 7, 2011

(87) PCT Pub. No.: WO2010/008085
PCT Pub. Date: Jan. 21, 2010

(65) Prior Publication Data
US 2011/0120326 A1    May 26, 2011

(30) Foreign Application Priority Data
Jul. 18, 2008    (JP) ................................. 2008-187655

(51) Int. Cl.
*B41N 1/24*    (2006.01)
(52) U.S. Cl.
USPC ..................................... 101/127; 101/128.21
(58) Field of Classification Search
USPC ........................................... 101/127, 128.21
IPC ....................................................... B41N 1/24
See application file for complete search history.

(56) References Cited

U.S. PATENT DOCUMENTS

| 2,065,322 | A | * | 12/1936 | Robertson | 101/127 |
| 7,156,017 | B1 | * | 1/2007 | Ingraselino | 101/129 |
| 2008/0017053 | A1 | | 1/2008 | Araumi et al. | |
| 2009/0025215 | A1 | | 1/2009 | Murakami et al. | |

FOREIGN PATENT DOCUMENTS

| JP | 7-45932 | 2/1995 |
| JP | 7-202429 | 8/1995 |
| JP | 7-336047 | 12/1995 |
| JP | 2004-253575 | 9/2004 |
| JP | 2006-73679 | 3/2006 |
| JP | 2009-285947 | 12/2009 |

OTHER PUBLICATIONS

Written Opinion and International Search Report in PCT/JP2009/063016, dated Sep. 8, 2009.

* cited by examiner

*Primary Examiner* — Leslie J Evanisko
(74) *Attorney, Agent, or Firm* — Cooper & Dunham LLP

(57) ABSTRACT

Disclosed is a screen plate for printing two-dimensionally arranged opening patterns by screen printing. The screen plate includes a dummy printing region in which a predetermined pattern is singly or plurally arranged along an edge part of one side or edge parts of two sides parallel to a printing direction of the screen plate; a full-surface printing region for performing full-surface printing, the full-surface printing region being formed into a belt shape at a position closer to a central side of the screen plate than the dummy printing region; and a printing region that is formed at a position closer to the central side than the full-surface printing region and in which the opening patterns are two-dimensionally arranged.

7 Claims, 17 Drawing Sheets

PRINTING DIRECTION

X DIRECTION / Y DIRECTION

PRINTING DIRECTION

SCREEN PLATE INCLUDING DUMMY PRINTING REGION AND FULL SURFACE SOLID PRINTING REGION

TECHNICAL FIELD

The present invention relates to a screen plate, an interlayer insulation film, a circuit substrate, an active matrix circuit substrate, and an image display apparatus.

BACKGROUND ART

Up until now, a multi-layer wiring has been widely used in a printed board and a ceramic substrate on which a ceramic green sheet is laminated. In the multi-layer wiring, a technology for connecting upper and lower wirings to each other, which are separated by an interlayer insulation film through contact holes (also referred to as via-holes), is required. With the proliferation of high integration and high speed of LSI, high-density packages of a printed wiring substrate and a ceramic substrate have also been demanded. Recently, technologies for connecting upper and lower wirings to each other through fine contact holes have become important.

There are two methods for forming an interlayer insulation film. With one method, an insulation film is first formed on an entire substrate by a sputtering method, a vacuum evaporation method, or the like. Next, the insulation film is coated with a photoresist and subjected to pre-baking, exposure, and development to form resist patterns. Then, through-holes are formed in the insulation film by dry etching such as RIE. In this manner, the interlayer insulation film is formed. With the other method, a substrate is first coated with a photoresist and subjected to pre-baking, exposure, and development to form resist patterns. Next, an insulation film is formed by the sputtering method, the vacuum evaporation method, or the like and impregnated with an organic solvent. Thus, the insulation film on the patterned resist is lifted off to be removed together with the resist. In this manner, the interlayer insulation film is formed. Both methods require an expensive vacuum film forming apparatus and a large number of manufacturing steps and are poor in use efficiency of a material serving as the insulation film, which results in increased manufacturing costs.

On the other hand, the rear-surface circuit substrate of a flat panel display requires high definition, a high-speed response, and a low cost. In addition, there is demand for an active matrix driven electronic circuit that can be manufactured at lower cost. In the flat panel display, individual through-holes arranged at a constant pitch are formed; they have a circular or rectangular form having a size of about 30 µm through 60 µm at 200 dpi and have a circular or rectangular form having a size of about 80 µm through 120 µm at 100 dpi. As a method for manufacturing an interlayer insulation film having such individual through-holes at lower cost, attention has been paid to a printing technology, in particular, a screen printing method.

Furthermore, in manufacturing a flat panel display, an interlayer insulation film is formed on an active matrix driven electronic circuit and then individual electrodes and a metal wiring are further formed on the interlayer insulation film. At this time, the electronic circuit and the individual electrodes are electrically connected to each other by electrical wiring through the individual through-holes (via-holes) of the interlayer insulation film. The screen printing method is also effective for forming such an electrical wiring.

Generally, in the screen printing method, the viscosity of a paste, which is used for forming an insulation film having no pattern by solid printing and forming electrodes by soldering, is a hundred and several tens Pa·s. In forming the patterns of fine individual through-holes (via-holes) or the like, pattern defects such as oozing and feathering due to insufficient viscosity of the paste or insufficient thixotropy are likely to be caused. For this reason, it is difficult to form uniform and nondefective fine patterns in a printing region, and yields cannot be improved in mass production.

Patent Document 1 describes a method for improving a pattern resolution by providing a dummy pattern region outside the region of patterns subjected to positive printing (where emulsion patterns are transferred as they are). With this method, when a protection film is printed on a semiconductor wafer by the screen printing method, dummy patterns having a width of 50 through 100 µm are provided at an interval of 50 through 2000 µm outside chip patterns. When the chip patterns at a peripheral part are printed, a tacking force increases due to the dummy patterns. As a result, a sufficient bonding time for transferring a paste to the chip patterns can be obtained, thin spots are hardly generated at the edge of the protection film, and uniform printing patterns can be formed.

Patent Document 1: JP-A-2004-253575

However, the method described in Patent Document 1 causes an excessive tacking force due to wide dummy patterns. In forming the individual through-holes of a flat panel display, variations in pattern dimension due to the excessive tacking force may directly lead to an increased element area at the outermost peripheral part of the patterns and finally cause reduced image quality. Furthermore, defects such as feathering and oozing may be caused in the individual through-holes at the outermost peripheral part, which establishes the necessity for accurately controlling the shapes of the individual through-holes at the outermost peripheral part. Therefore, the patterns have to be arranged so that a transfer amount of the paste becomes uniform at the dummy pattern region, which results in difficulties in practice.

DISCLOSURE OF INVENTION

In light of the above problems, the present invention may provide a screen plate for printing fine opening patterns easily and at low cost, an interlayer insulation film formed using the screen plate, a circuit substrate, an active matrix circuit substrate, and an image display apparatus.

According to an embodiment of the present invention, there is provided a screen plate for printing two-dimensionally arranged opening patterns by screen printing. The screen plate includes a dummy printing region in which a predetermined pattern is singly or plurally arranged along an edge part of one side or edge parts of two sides parallel to a printing direction of the screen plate; a full-surface printing region for performing full-surface printing, the full-surface printing region being formed into a belt shape at a position closer to a central side of the screen plate than the dummy printing region; and a printing region that is formed at a position closer to the central side than the full-surface printing region and in which the opening patterns are two-dimensionally arranged.

BEST MODE FOR CARRYING OUT THE INVENTION

Next, a description is made of embodiments of the present invention.

First Embodiment

In this embodiment, an interlayer insulation film in which opening patterns are two-dimensionally arranged by a screen printing method is formed by printing. This embodiment is described based on FIGS. 1 and 2.

Figure 1:
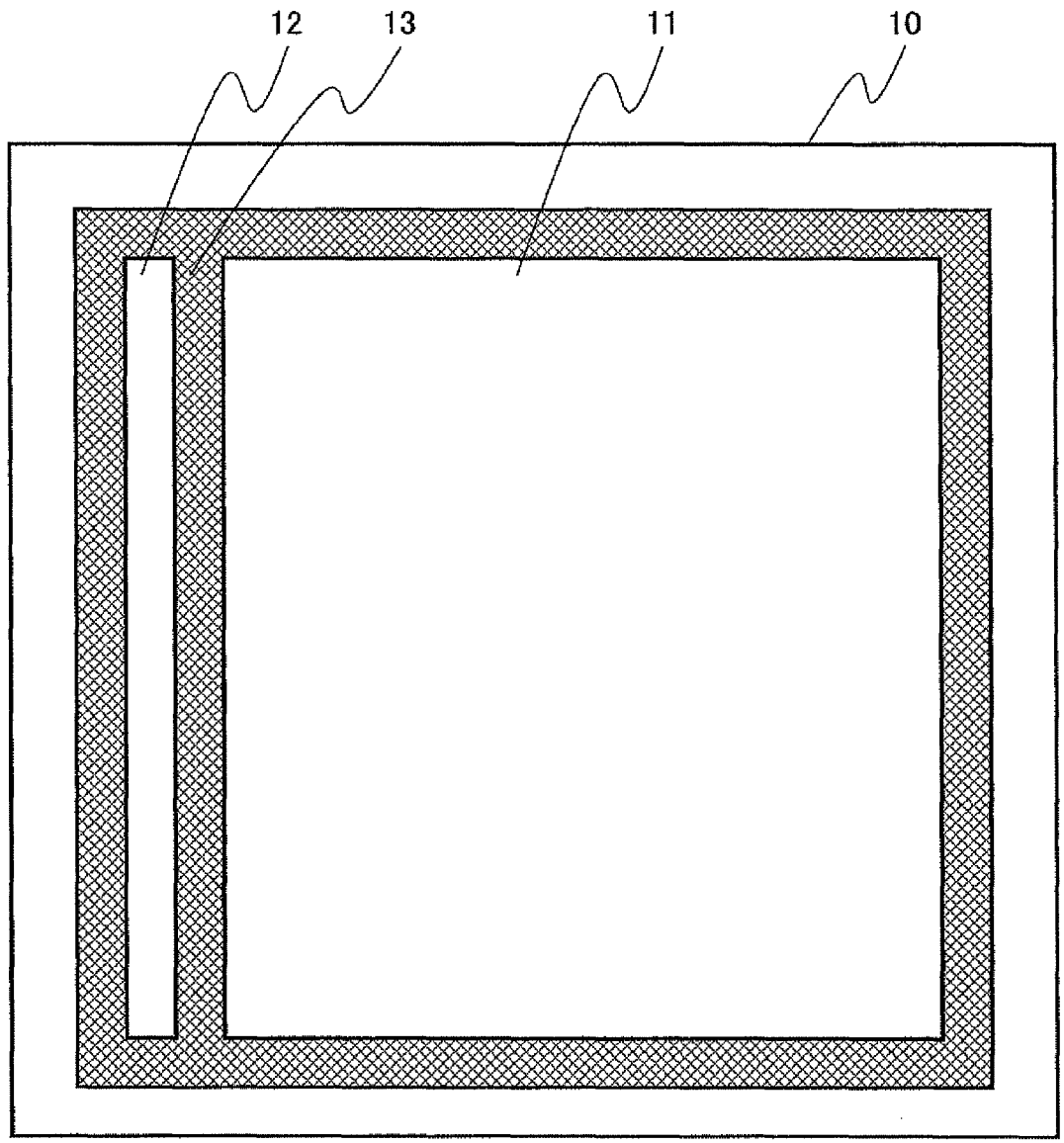
FIG. 1 is a top view of a screen plate according to a first embodiment.
Figure 1:
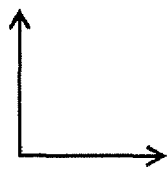
Figure 1:
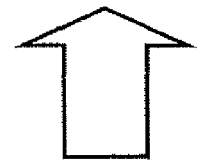

FIG. 1 is a diagram showing the top surface of a screen plate 10 according to this embodiment. A method for manufacturing the screen plate 10 is described.

First, a plain-woven stainless steel mesh is attached to a screen plate frame through a polyester mesh with predetermined tension in the form of double bias combination.

Next, one surface of the stainless steel mesh is coated with a photosensitive emulsion and baked repeatedly to form a masking emulsion with a predetermined thickness.

Then, a Cr-pattern glass original plate, in which patterns serving as regions where a printing paste passes through are formed, is closely attached to the front surface of the masking emulsion and exposed by an exposure unit.

Next, the masking emulsion is developed to form patterns made of the predetermined masking emulsion. Note that it is desired that calendar processing be applied to the screen plate as occasion demands.

In this manner, the screen plate 10 according to this embodiment is manufactured. In the screen plate 10, a dummy printing region 12 is formed at an edge part on a side along a printing direction, a full-surface printing region 13 parallel to the printing direction is formed adjacent to the dummy printing region 12, and a printing region 11 where printing patterns composed of predetermined opening patterns are formed is formed inside the full-surface printing region 13.

Figure 2:
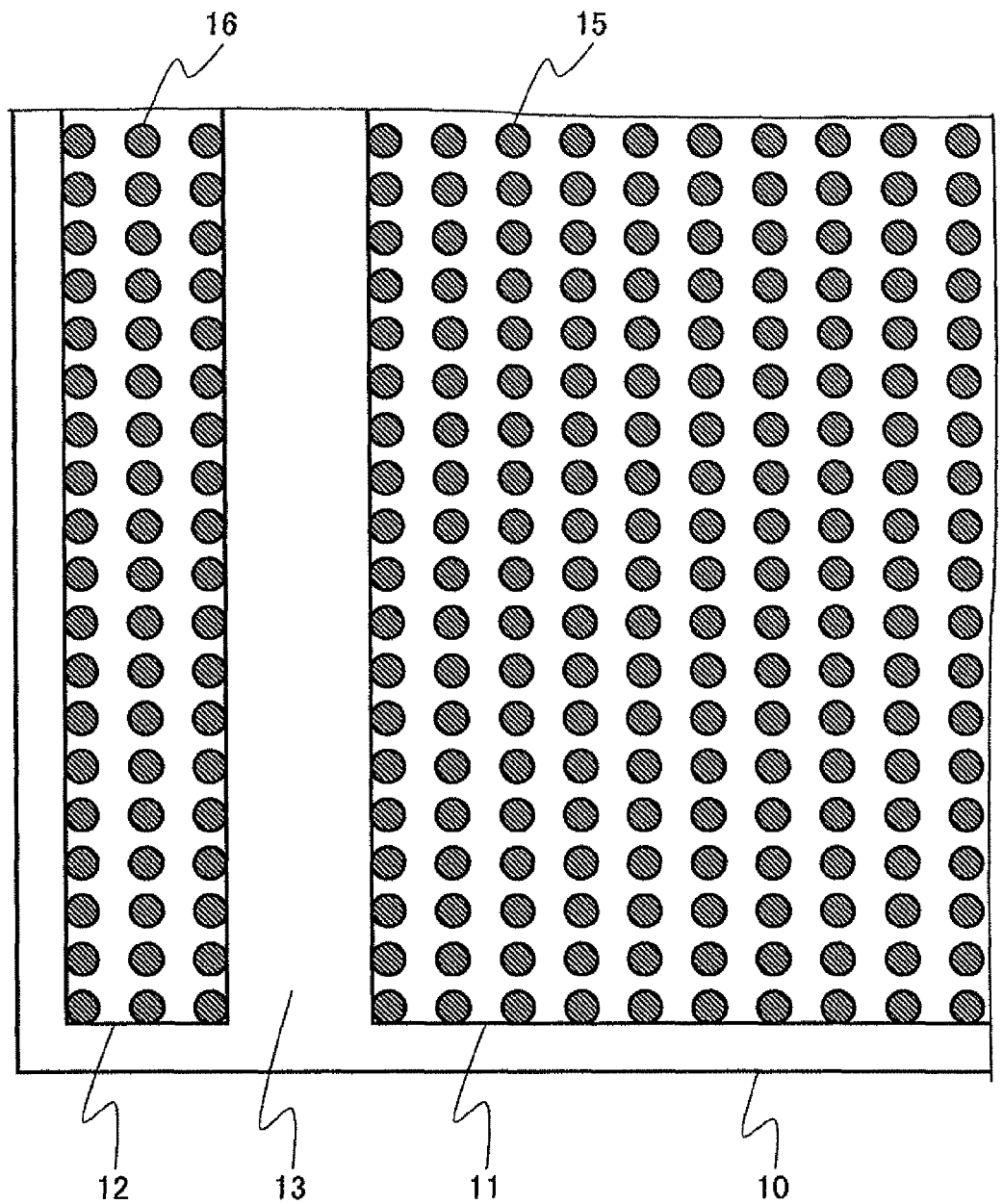
FIG. 2 is an enlarged top view of the screen plate according to the first embodiment.
Figure 2:
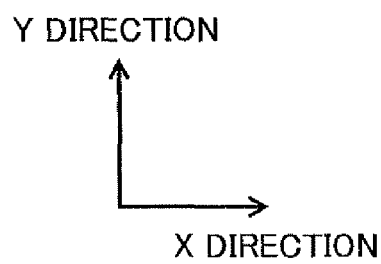
Figure 2:

Based on FIG. 2, the patterns of the masking emulsion in the screen plate 10 are described. In the dummy printing region 12, dummy printing patterns 16 are formed in such a manner that patterns to be printed become predetermined opening patterns. The masking emulsion is formed at regions where the opening patterns are formed. Accordingly, when a printing paste is used to perform printing, the printing paste does not pass through the regions where the masking emulsion is formed but passes through regions where the masking emulsion is not formed. Thus, the printed patterns become the opening patterns having opening parts corresponding to the regions where the masking emulsion is formed, i.e., the dummy printing patterns 16.

In the full-surface printing region 13, the masking emulsion is not formed. Therefore, when the printing paste is used to perform printing, the printing paste passes through the full-surface printing region 13 whereby full-surface printing, i.e., so-called solid printing is performed.

In the printing region 11, printing patterns 15 are formed in such a manner that patterns to be printed become predetermined opening patterns. The masking emulsion is formed at regions where the opening patterns are formed. Accordingly, when the printing paste is used to perform printing, the printing paste does not pass through the regions where these masking emulsion is formed but passes through regions where the masking emulsion is not formed. Thus, the printed patterns become the opening patterns having opening parts corresponding to the regions where the masking emulsion is formed, i.e., the printing patterns 15.

Next, based on FIG. 3, a description is made of a screen printing method using the screen plate according to this embodiment. Note that an insulating paste is used as the printing paste.

Figure 3A:
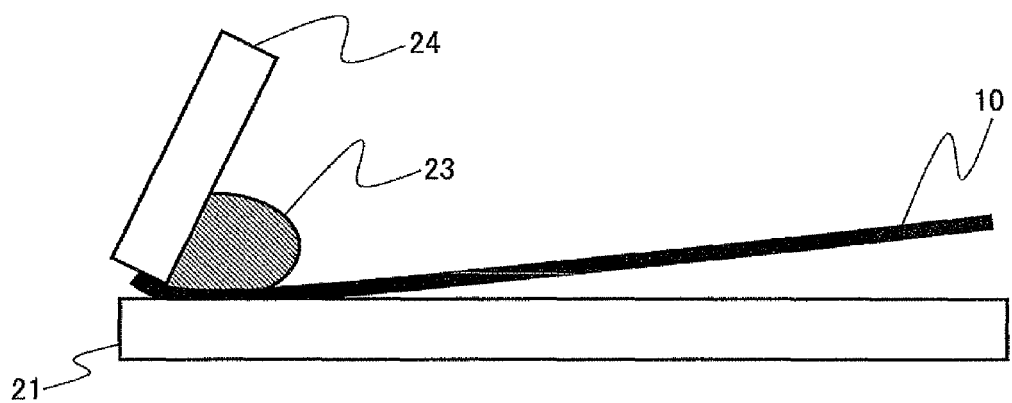
FIGS. 3A through 3C are process drawings in screen printing using the screen plate according to the first embodiment.

As shown in FIG. 3A, the screen plate 10 according to this embodiment is provided on a substrate 21, and a squeegee 24 is used to apply an insulating paste 23. The insulating paste 23 used for printing is made of inorganic filler particles, a thermoplastic resin binder, butyl carbitol, and the like. When patterns are printed at a fine pitch, it is preferable that the viscosity of the insulating paste 23 be about 260 Pa·s (measurement is performed at 10 rpm using a Brookfield HBT No. 14 spindle). A clearance between the screen plate 10 and the substrate 21 is appropriately set according to the size of the screen plate 10.

Figure 3B:
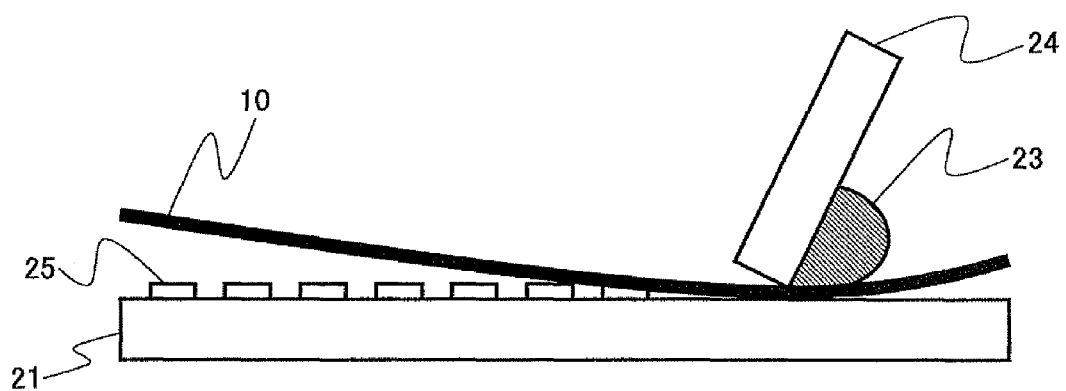

Then, as shown in FIG. 3B, squeegee 24 is moved to perform screen printing. The squeegee 24 used at this time is a rubber flat squeegee, and screen printing is performed on the condition that an attack angle is 70° and a printing speed is in the range of 10 through 80 mm/s. Thus, printing patterns 25 made of the insulating paste are formed on the front surface of the substrate 21.

The above screen printing method is further specifically described. When the insulating paste 23 is applied, the screen plate 10 is provided at a position several millimeters away from the substrate 21 to be printed. Then, the insulating paste 23 is thinly coated on the screen plate 10, and the screen plate 10 is pressed against the substrate 21 to be printed by the squeegee 24 to perform printing. When being pressed by the squeegee 24, the screen plate 10 is expanded and brought into line contact with the front surface of the substrate 21. The region where the screen plate 10 is brought into line contact with the front surface of the substrate 21 is moved along with the movement of the squeegee 24. At this time, the insulating paste 23 passes through the regions where the masking emulsion is not formed in the screen plate 10 to form the printing patterns 25 on the substrate 21. Note that the insulating paste 23 does not pass through the regions where the masking emulsion is formed in the screen plate 10 because the regions are masked by the masking emulsion.

The region where the screen plate 10 is brought into line contact with the substrate 21 as the squeegee 24 moves is separated from the substrate 21 along with the movement of the squeegee, which is called plate separation of the screen printing. At this plate separation, a strong shearing force is applied to a contact part between the screen plate 10 and the insulating paste 23. The viscosity of the insulating paste 23, which has received the shearing force due to the plate separation, rapidly decreases, and the insulating paste 23 is transferred to the front surface of the substrate 21.

Here, a bonding force called a tacking force is generated between the screen plate 10 and the substrate 21 although it is different depending on the viscosity of the insulating paste 23 to be used, printing conditions, the arrangement of printing patterns, or the like. The tacking force is different depending on the viscosity of the insulating paste 23 to be used and printing conditions such as wettability effect of the insulating paste 23 on the screen plate 10 and a substrate to be printed.

Generally, when solid printing by which the insulating paste 23 entirely passes through is performed in a wide region, a contact region between the substrate 21 and the screen plate 10 is large, which results in a strong tacking force. On the other hand, when the many masking regions made of the masking emulsion are formed, the contact region between the substrate 21 and the screen plate 10 is narrow, which results in a weak tacking force. Furthermore, the restoration force of the screen plate 10 is set in consideration of easiness of separating the screen plate 10 from the substrate 21. However, at the region where the screen plate 10 is brought into line contact with the substrate 21 by the squeegee 24, the restoration force at a central part of the screen plate 10 is smaller than that at both end parts.

In addition, generally, even if the printing patterns are masked by the emulsion, the printing paste is transferred in front of the squeegee and a transfer amount of the printing paste is different between solid printing regions where solid printing is performed and pattern regions where the patterns are printed. Therefore, "oozing" is caused in which the printing paste oozes from the solid printing regions to the pattern regions.

However, in this embodiment, since the dummy printing region 12 and the full-surface printing region 13 are provided in the screen plate 10, the transfer amount of the printing paste can be kept as uniform as possible at the printing region 11 near both ends of the squeegee 24. Therefore, feathering of the patterns or the like due to the oozing and a delay in the plate separation is hardly caused.

Figure 3C:
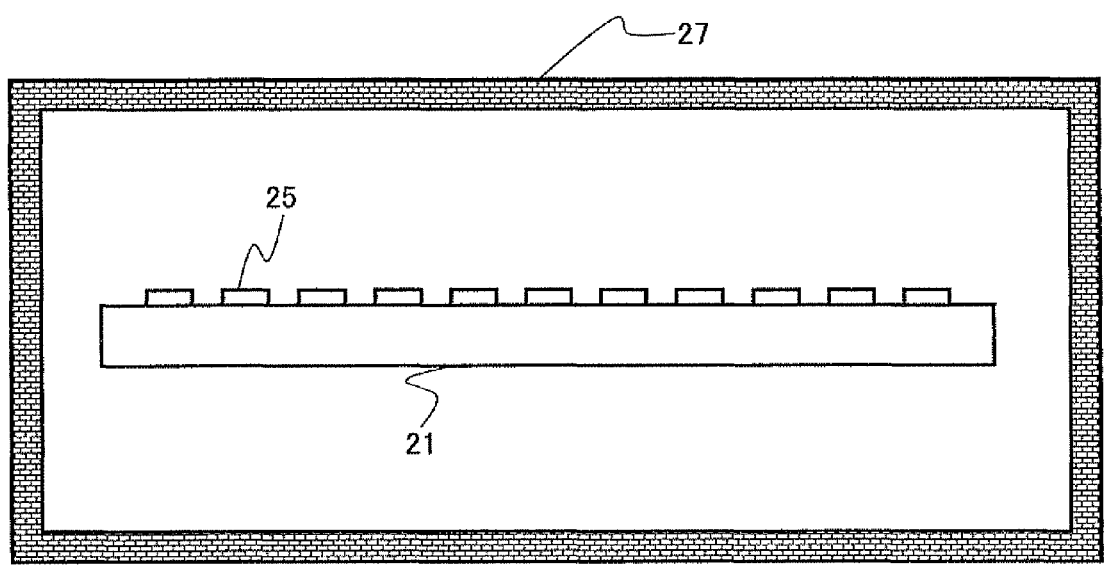

The substrate on which the screen printing is performed in this manner is put in a forced convection type oven 27 as shown in FIG. 3C and heated to harden the insulating paste serving as the printing patterns 25 to form an insulation film. At this time, the insulating paste is required to be heated at 250° for 60 minutes.

Note that as the substrate 21, a paper, a glass substrate, a quartz substrate, a ceramic substrate, a plastic substrate such as PES (polyether sulfone), PEN (polyethylene naphthalate), PI (polyimide), and PET (polyethylene terephthalate), and a semiconductor substrate such as Si and GaAs are available. Furthermore, the insulating paste 23 is available so long as it can correspond to fine pitch printing and be used to perform the screen printing.

Furthermore, it is preferable that the screen mesh of the screen plate 10 according to this embodiment have 360 through 800 stainless steel wires per inch. Specifically, it is preferable that pattern pitches "ax" and "ay" between the printing patterns 15 in x and y directions, respectively, in the printing region 11 of the screen plate shown in FIG. 4 be in the range of 100 through 400 µm. In manufacturing the screen plate 10, the masking emulsion is desirably supported by about three or four intersections of the stainless steel wires of the mesh in view of strength. Generally, the emulsion three or four times as large as the opening part of the mesh has to be manufactured. At present, the screen plate having 500 meshes per inch is the finest among those used at a mass production level. The limit size of the emulsion capable of being supported by 500 meshes in view of strength is about 30 µm under present circumstances. When the printing patterns and the printing region are designed under such a limitation on an emulsion size relative to the meshes, the transfer amount of the printing paste can be controlled. Therefore, effects of the present invention can be particularly remarkably obtained. In the future, if finer meshes were applied to the manufacturing of the screen plate, the limitation on the emulsion size would be further relaxed, which in turn would make it possible to form finer patterns.

Furthermore, it is preferable that a width "cL" of the full-surface printing region 13 be greater than or equal to one time and less than or equal to 15 times as large as the pattern pitch "ax" between the printing patterns 15 in the x-direction. As described below, when the full-surface printing region 13 is formed within this range, the screen printing of the printing patterns can be performed in the printing region 11 without causing any defects.

Furthermore, when the insulating paste 23 is measured at 10 rpm using the Brookfield HBT No. 14 spindle, it is preferable that the viscosity of the insulating paste 23 be in the range of 150 through 350 Pa·s. Within this range, the same effect as the above can be obtained.

Second Embodiment

This embodiment refers to the shapes of the full-surface printing region 13 and the dummy printing patterns 16 in the screen plate 10.

A description is now made of the shapes of the dummy printing patterns 16 based on FIGS. 5A through 5G. Examples of the shapes of the dummy printing patterns 16 include a circle shown in FIG. 5A, an ellipse shown in FIG. 5B, a doughnut shown in FIG. 5C, a square shown in FIG. 5D, a rhombus shown in FIG. 5E, a rectangle shown in FIG. 5F, and a hexagon shown in FIG. 5G, the circle having a diameter of 20 µm or greater, the polygon having a side of 20 µm or greater. When the dummy printing patterns 16 are formed into these shapes, the effects of the present invention can be obtained.

Figure 6:
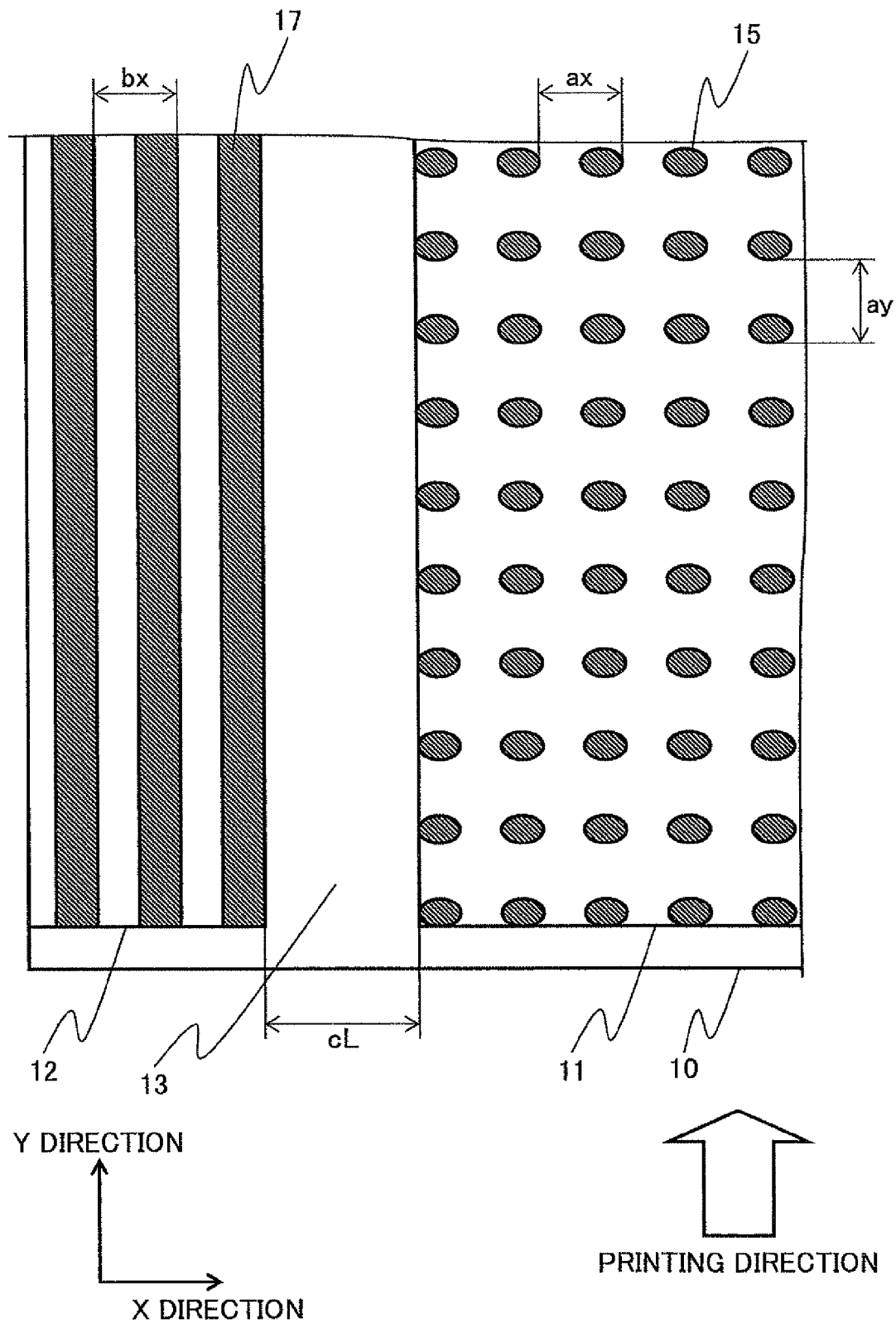
FIG. 6 is a pattern layout drawing of a screen plate according to the second embodiment.

Furthermore, the patterns formed in the dummy printing region 12 may be belt-shaped dummy printing patterns 17 parallel to the printing direction shown in FIG. 6. Note that the width of the belt-shaped dummy printing patterns 17 is 20 µm or greater. Even if the dummy printing patterns 17 are formed into such a shape, the effects of the present invention can be obtained.

Figure 7:
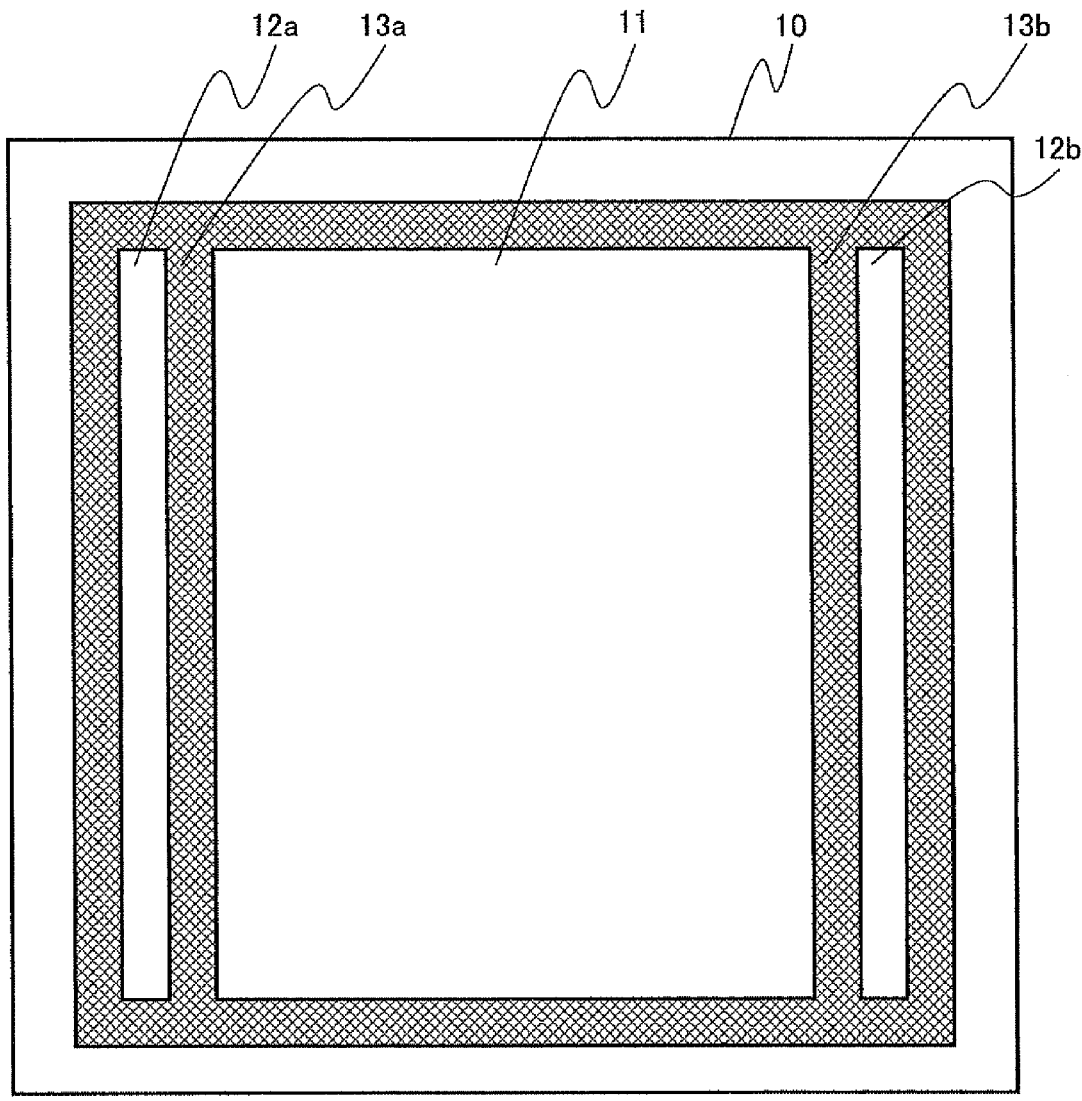
FIG. 7 is a top view (1) of the screen plate according to the second embodiment.
Figure 8:
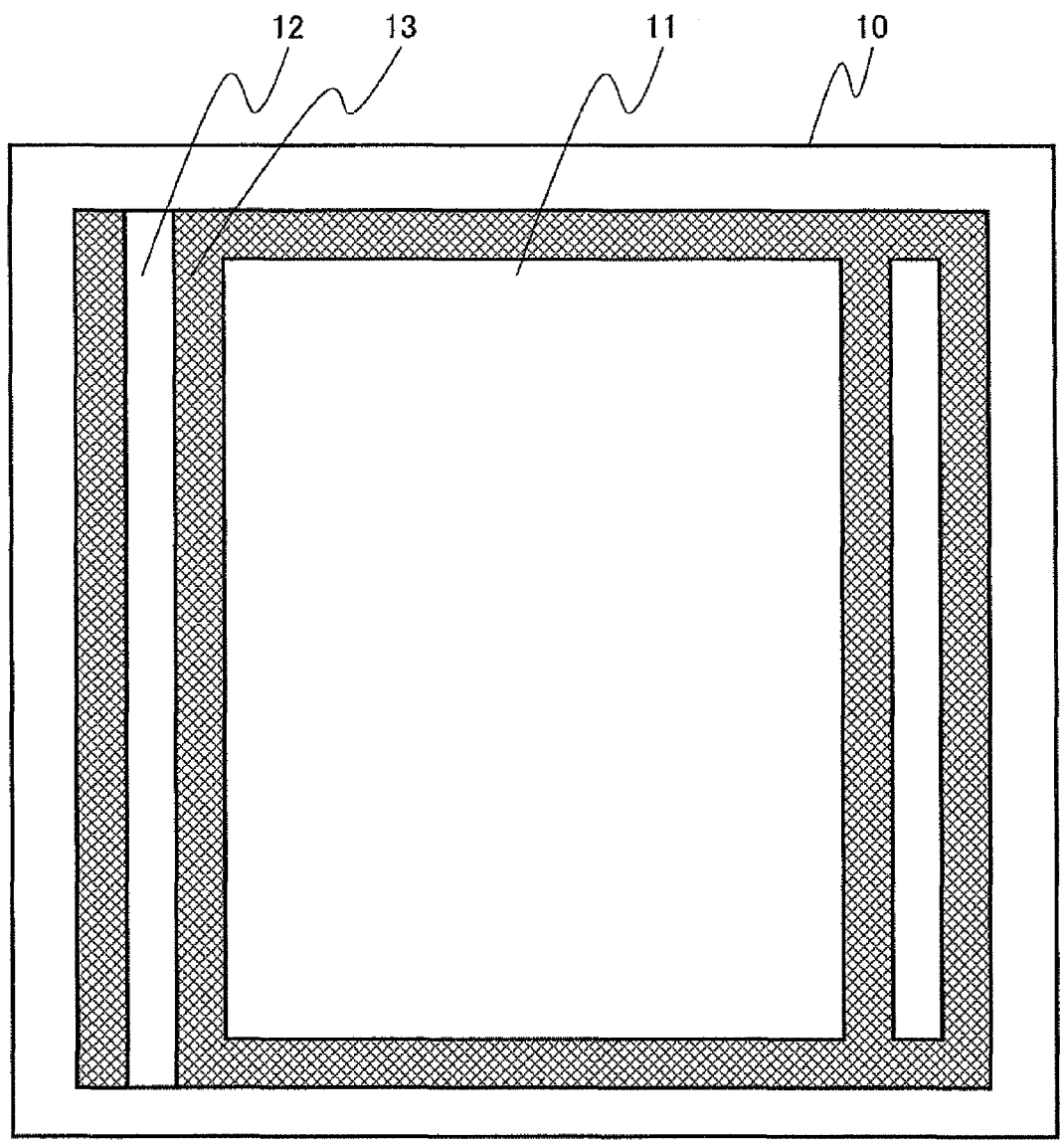
FIG. 8 is a top view (2) of the screen plate according to the second embodiment.
Figure 8:
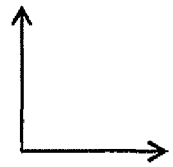
Figure 8:
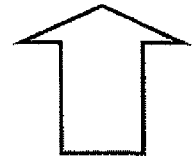

Furthermore, as shown in FIG. 7, the screen plate 10 may be so arranged that dummy printing regions 12a and 12b and full-surface printing regions 13a and 13b are provided along two sides parallel to the printing direction, i.e., along the two sides one on each side of the printing region 11. With this arrangement, the printing patterns 15 can be formed at the entire surface of the printing region 11 without causing defects at higher levels. Moreover, as shown in FIG. 8, the screen plate 10 may be so arranged that the length of the dummy printing region 12 is made longer than that of the printing region 11 in the printing direction.

Third Embodiment

A description is now made of a third embodiment. This embodiment refers to an active matrix circuit substrate based on the present invention and a method for forming the active matrix circuit substrate.

Figure 9:
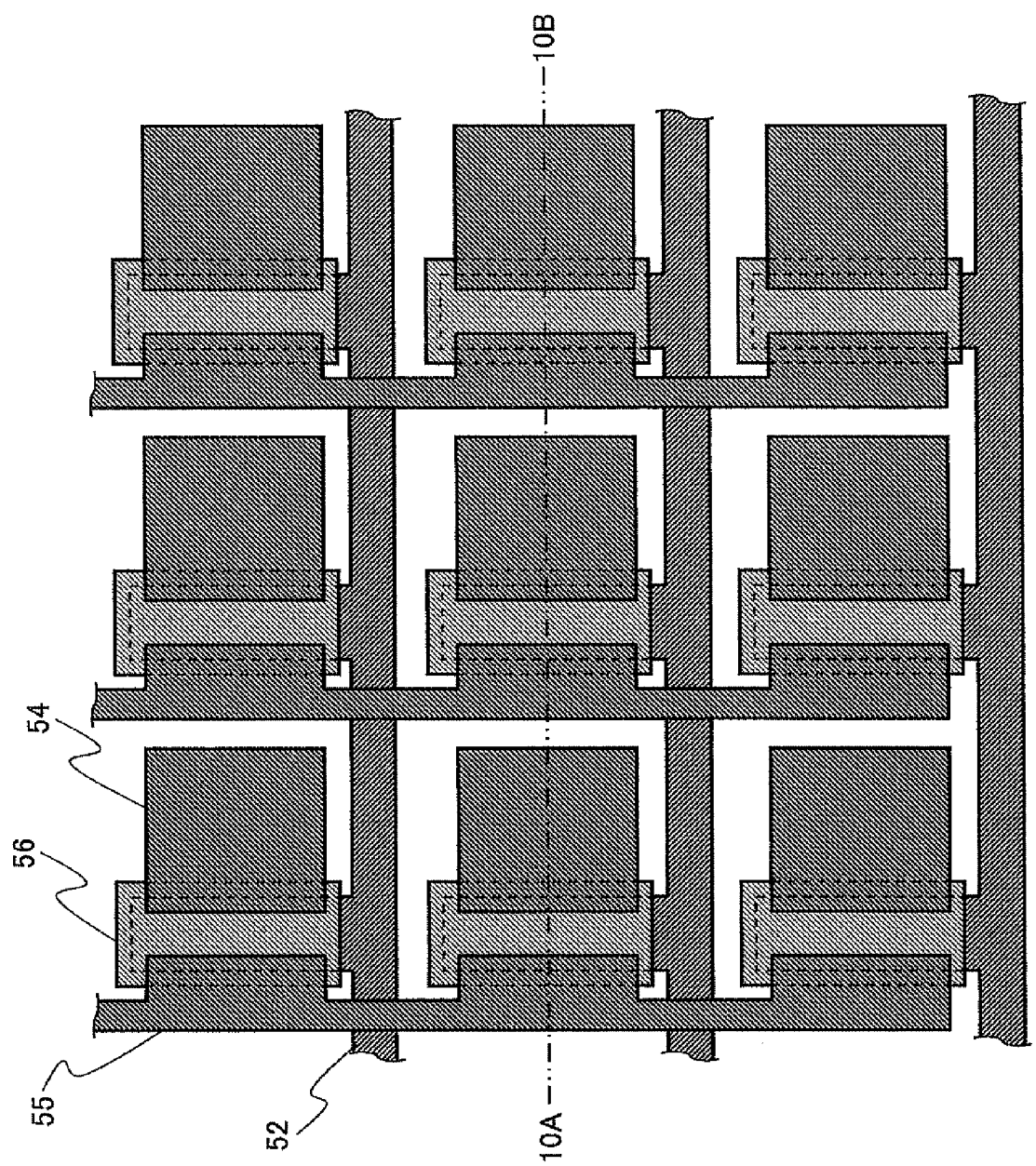
FIG. 9 is a top view of an active matrix circuit substrate according to a third embodiment.
Figure 10:
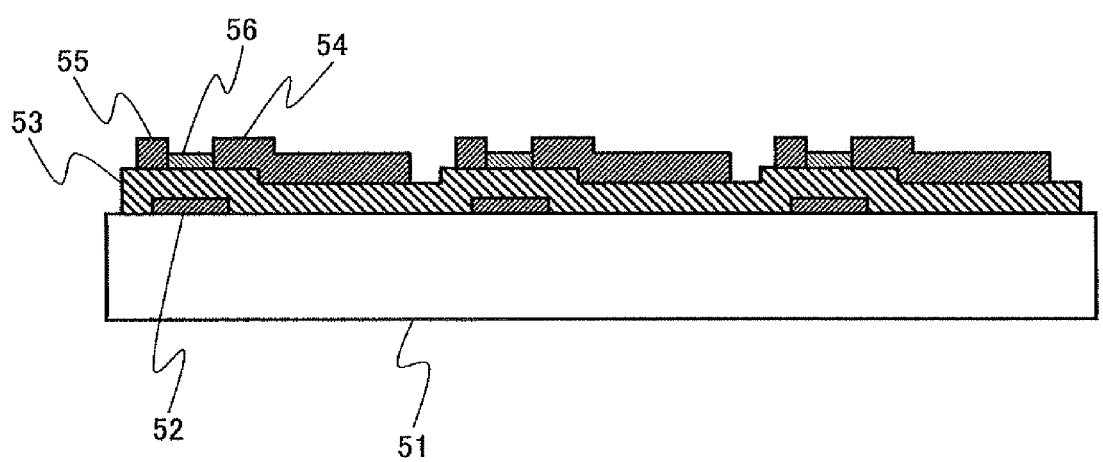
FIG. 10 is a cross-sectional view (1) of the active matrix circuit substrate according to the third embodiment.

The active matrix circuit substrate according to this embodiment is manufactured in such a manner that an interlayer insulation film and individual electrodes are formed on a circuit substrate shown in FIGS. 9 and 10.

FIG. 9 is a top view showing the wiring pattern of the circuit substrate, and FIG. 10 is a cross-sectional view taken along the line 10A-10B in FIG. 9. In this circuit substrate, TFTs (thin film transistors) are arranged on a substrate 51 made of quart or glass in a two-dimensional matrix form. Each of the TFTs uses as electrodes a gate electrode 52 that is made of Al and formed on the substrate 51, a drain electrode 54, and a source electrode 55, and it is composed of a gate insulation film 53 made of $SiO_2$ and a semiconductor layer 56 made of Si.

Note that the gate electrode 52, the drain electrode 54, and the source electrode 55 are formed as follows. That is, a film is first formed by a sputtering method using Cr, Cu, Au, or the like and coated with a photoresist. Then, the film is subjected to pre-baking, exposure, and development to form a resist pattern. After that, the resist pattern is subjected to etching such as RIE. As a result, the gate electrode 52, the drain electrode 54, and the source electrode 55 are formed. Furthermore, the gate insulation film 53 is formed when an insulation film made of an oxide silicon or a silicon nitride is formed by a plasma CVD method.

Figure 11:
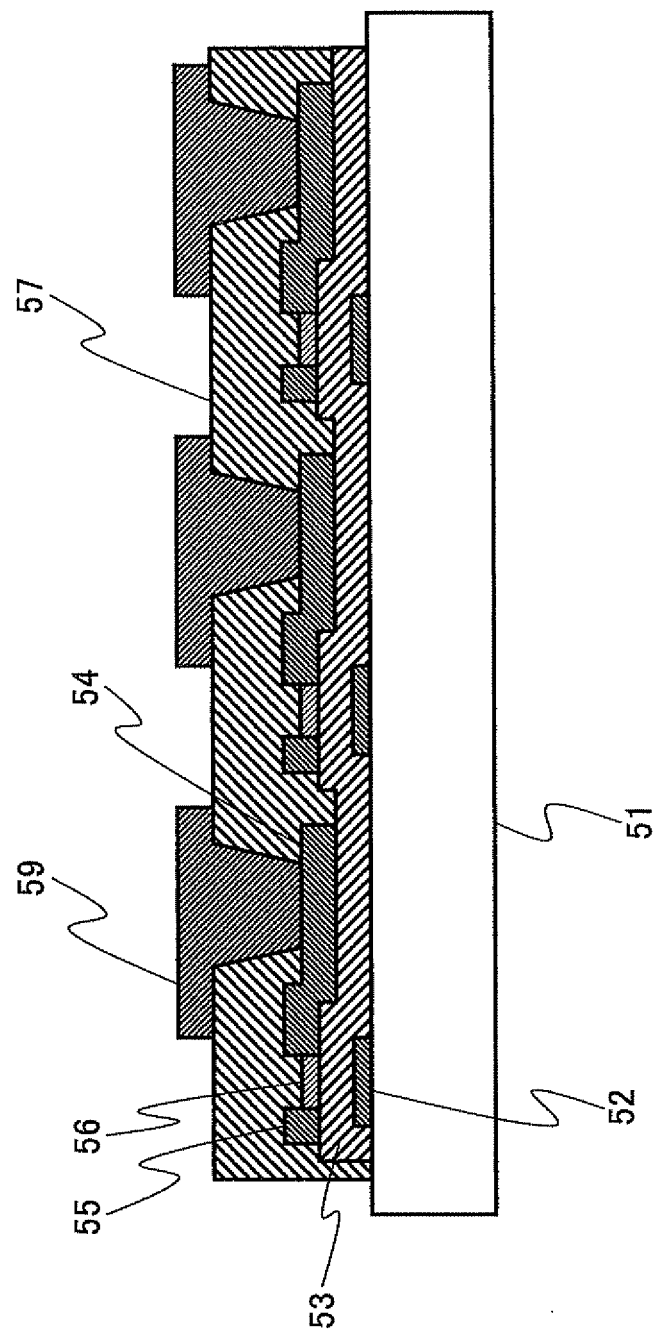
FIG. 11 is a cross-sectional view (2) of the active matrix circuit substrate according to the third embodiment.

Next, as shown in FIG. 11, the screen printing is performed on the circuit substrate using the screen plate according to the first embodiment to form an interlayer insulation film 57. The interlayer insulation film 57 has through-holes corresponding to the TFTs. When a conductive material fills in the through-holes, the drain electrodes 54 of the TFTs are electrically connected to the individual electrodes 59. In this manner, the active matrix circuit substrate according to this embodiment is manufactured.

Fourth Embodiment

A description is now made a fourth embodiment. This embodiment refers to an image display apparatus according to the present invention.

Specifically, electrophoretic elements as image display elements are formed using the active matrix circuit substrate manufactured according to the third embodiment.

Figure 12:
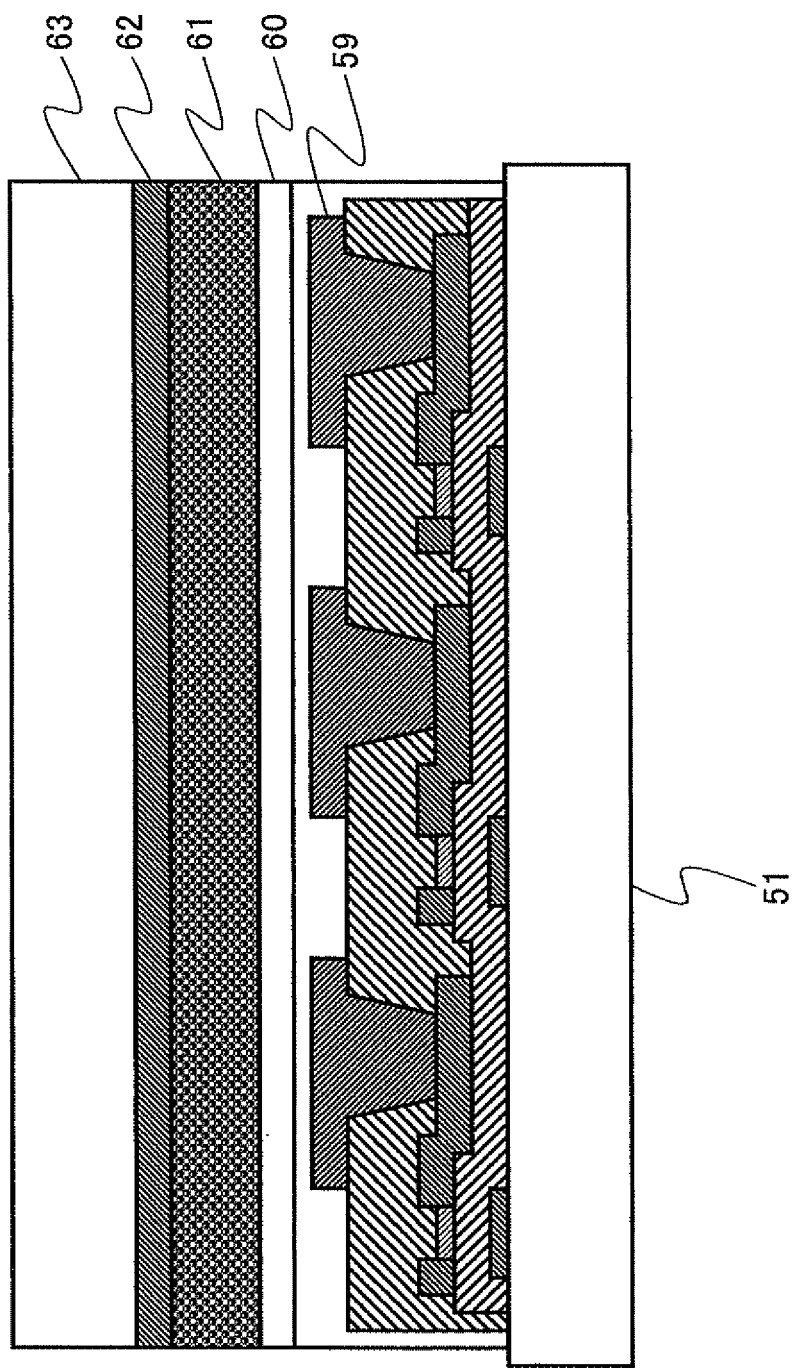
FIG. 12 is a cross-sectional view of an image display apparatus according to a fourth embodiment.

The image display apparatus according to this embodiment is described based on FIG. 12.

At the surface where the individual electrodes 59 of the active matrix circuit substrate manufactured according to the third embodiment are formed, an electrophoretic display element layer 61, in which isoper colored by, for example, oil blue and oxide-titanium particles are encapsulated, is laminated through a bonding layer 60. In addition, an upper substrate 63 having a common electrode 62 is further bonded to the electrophoretic display element layer 61. Thus, the image display apparatus is formed.

The display elements used in this embodiment may be electrochromic elements and polymer-dispersed liquid crystal elements other than the electrophoretic display elements according to this embodiment.

EXAMPLES

Next, a description is now made of examples according to the present invention. Specifically, the screen plates having the following configurations were manufactured, and then printing was performed using the insulating paste to obtain results.

Example 1

Figure 4:
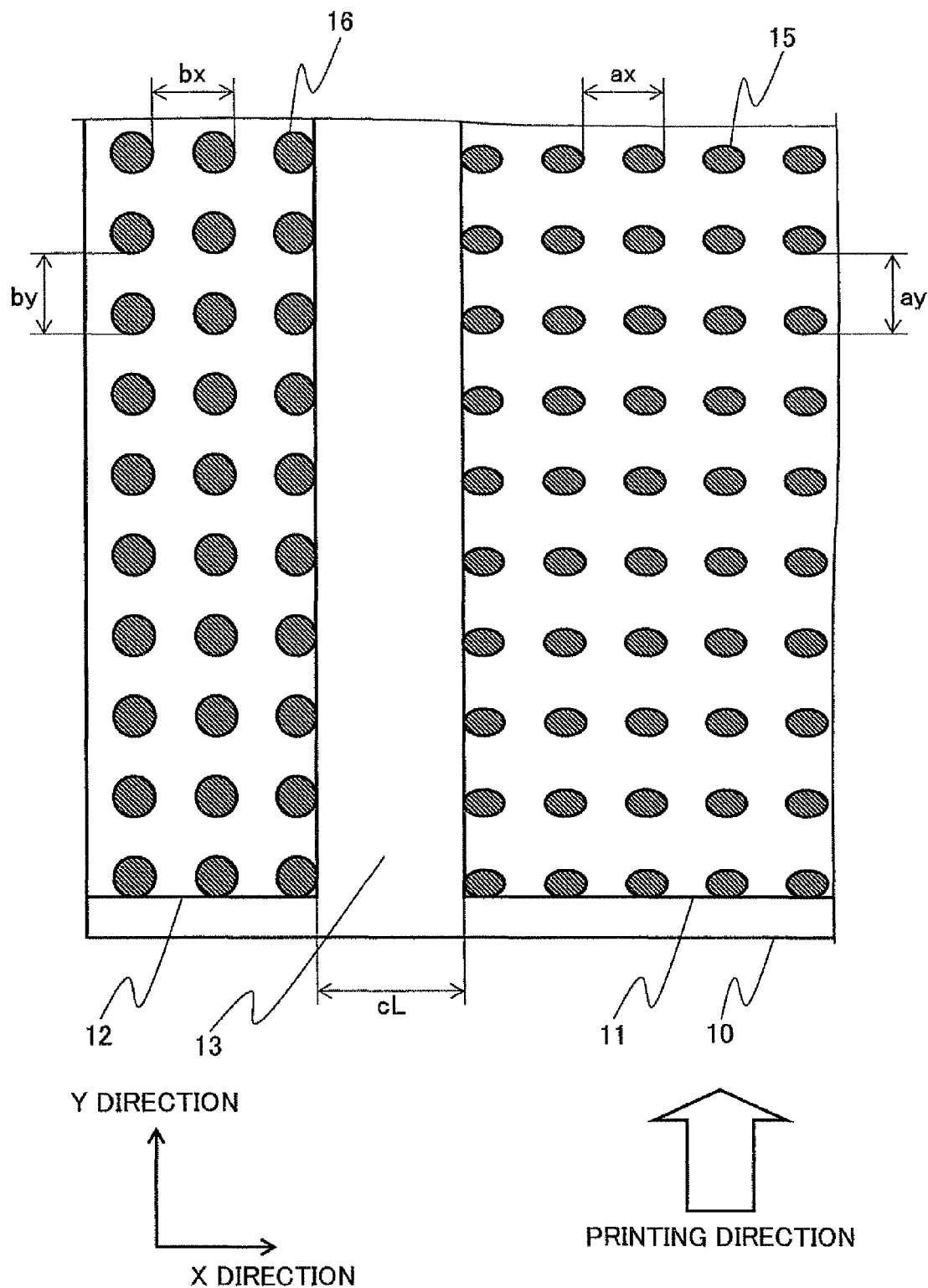
FIG. 4 is a pattern layout drawing of the screen plate according to the first embodiment.
Figure 5A:
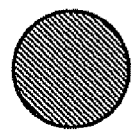
FIGS. 5A through 5G are drawings showing the patterns of dummy printing patterns according to a second embodiment.
Figure 5B:
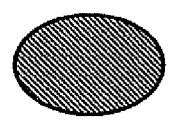
Figure 5C:
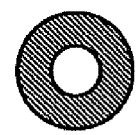
Figure 5D:
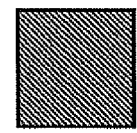
Figure 5E:
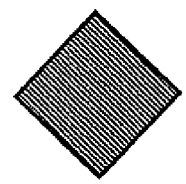
Figure 5F:
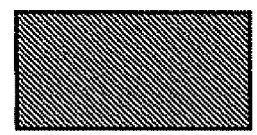
Figure 5G:
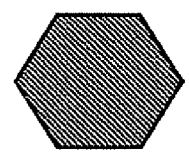

The screen mesh of the screen plate according to example 1 is composed of 400 plain-woven stainless steel wires per inch. As shown in FIG. 4, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the circular dummy printing patterns 16 each having a diameter of 200 μm are formed and two-dimensionally arranged by 3×800 at a pattern pitch "bx" of 300 μm in the x-direction and a pattern pitch "by" of 300 μm in the y-direction. Furthermore, the full-surface printing region 13 of the screen plate 10 is formed into a belt shape having a width "cL" of 700 μm (2.3 times as large as the pattern pitch "ax" between the printing patterns 15 in the x-direction).

Comparative Example 1

The screen mesh of the screen plate according to comparative example 1 is composed of 400 plain-woven stainless steel wires per inch. In the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Note that the dummy printing region 12 and the full-surface printing region 13 are not formed in the screen plate 10.

Example 2

The screen mesh of the screen plate according to example 2 is composed of 400 plain-woven stainless steel wires per inch. As shown in FIG. 4, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the circular dummy printing patterns 16 each having a diameter of 200 μm are formed and two-dimensionally arranged by 3×800 at the pattern pitch "bx" of 300 μm in the x-direction and the pattern pitch "by" of 300 μm in the y-direction. Furthermore, the full-surface printing region 13 of the screen plate 10 is formed into a belt shape having a width "cL" of 2100 μm (7 times as large as the pattern pitch "ax" between the printing patterns 15 in the x-direction).

Example 3

The screen mesh of the screen plate according to example 3 is composed of 400 plain-woven stainless steel wires per inch. As shown in FIG. 4, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12, the circular dummy printing patterns 16 each having a diameter of 200 μm are formed and two-dimensionally arranged by 3×800 at the pattern pitch "bx" of 300 μm in the x-direction and the pattern pitch "by" of 300 μm in the y-direction. Furthermore, the full-surface printing region 13 of the screen plate 10 is formed into a belt shape having a width "cL" of 4500 μm (15 times as large as the pattern pitch "ax" between the printing patterns 15 in the x-direction).

Comparative Example 2

The screen mesh of the screen plate according to comparative example 2 is composed of 400 plain-woven stainless steel wires per inch. As shown in FIG. 4, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the circular dummy printing patterns 16 each having a diameter of 200 μm are formed and two-dimensionally arranged by 3×800 at the pattern pitch "bx" of 300 μm in the x-direction and the pattern pitch "by" of 300 μm in the y-direction. Furthermore, the full-surface printing region 13 of the screen plate 10 is formed into a belt shape having a width "cL" of 4800 μm (16 times as large as the pattern pitch "ax" between the printing patterns 15 in the x-direction).

Comparative Example 3

The screen mesh of the screen plate according to comparative example 3 is composed of 400 plain-woven stainless steel wires per inch. As shown in FIG. 4, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the circular dummy printing patterns 16 each having a diameter of 200 μm are formed and two-dimensionally arranged by 3×800 at the pattern pitch "bx" of 300 μm in the x-direction and the pattern pitch "by" of 300 μm in the y-direction. Furthermore, the full-surface printing region 13 of the screen plate 10 is formed into a belt shape having a width "cL" of 9000 μm (30 times as large as the pattern pitch "ax" between the printing patterns 15 in the x-direction).

Example 4

Figure 13:
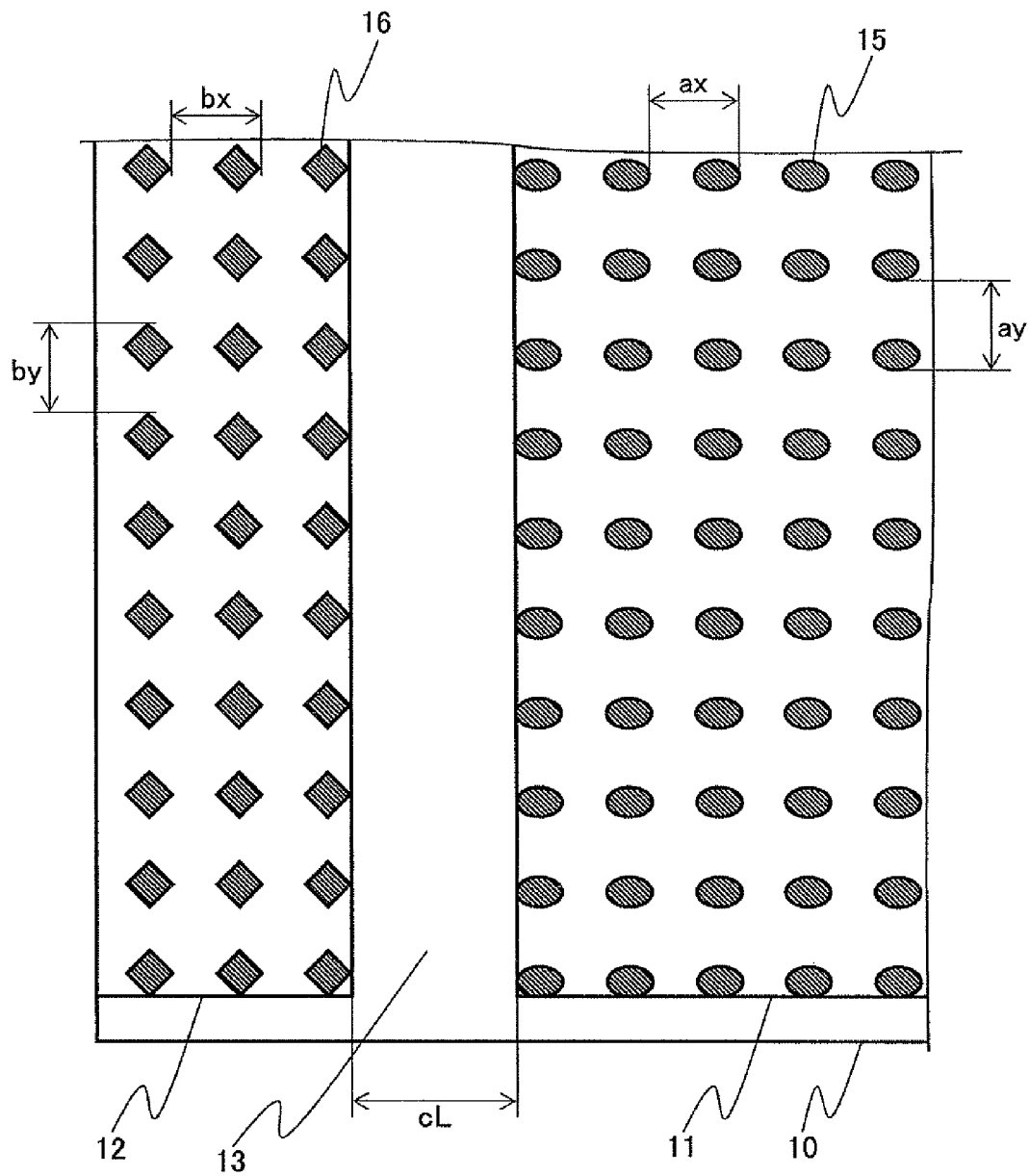
FIG. 13 is a pattern layout drawing of the screen plate according to the fourth embodiment.

The screen mesh of the screen plate according to example 4 is composed of 400 plain-woven stainless steel wires per inch. As shown in FIG. 13, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the rhomboid dummy printing patterns 16 each having a side of 150 μm are formed and two-dimensionally arranged by 6×800 at the pattern pitch "bx" of 400 μm in the x-direction and the pattern pitch "by" of 300 μm in the y-direction (some are omitted for convenience of FIG. 13). Furthermore, the full-surface printing region 13 of the screen plate 10 is formed into a belt shape having a width "cL" of 700 μm (2.3 times as large as the pattern pitch "ax" between the printing patterns 15 in the x-direction).

Example 5

The screen mesh of the screen plate according to example 5 is composed of 400 plain-woven stainless steel wires per inch. As shown in FIG. 6, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the three belt-shaped dummy printing patterns 17 each having a width of 200 μm are formed and arranged at the pattern pitch "bx" of 300 μm in the x-direction. Furthermore, the full-surface printing region 13 is formed into a belt shape having a width "cL" of 700 μm (2.3 times as large as the pattern pitch "ax" between the printing patterns 15 in the x-direction).

Example 6

The screen mesh of the screen plate according to example 6 is composed of 400 plain-woven stainless steel wires per inch. Specifically, as shown in FIG. 7, the dummy printing regions 12a and 12b and the full-surface printing regions 13a and 13b are formed on both sides of the printing region 11. As shown in FIG. 4, in the printing region 11 of the screen plate 10, the elliptical printing patterns 15 each having a long axis of 160 μm in the x-direction and a short axis of 120 μm in the y-direction are formed. The printing patterns 15 are two-dimensionally arranged by 1000×800 at the pattern pitch "ax" of 300 μm in the x-direction and the pattern pitch "ay" of 300 μm in the y-direction. Furthermore, in the dummy printing region 12 of the screen plate 10, the circular dummy printing patterns 16 each having a diameter of 200 μm are formed and two-dimensionally arranged by 3×800 at the pattern pitch "bx" of 300 μm in the x-direction and the pattern pitch "by" of 300 μm in the y-direction. Furthermore, the full-surface printing region 13 of the screen plate 10 is formed into a belt shape having a width "cL" of 2100 μm (7 times as large as the pattern pitch "ax" between the printing patterns 15 in the x-direction). The above configuration is also formed on the opposite side of the screen plate 10.

Example 7

Figure 14:
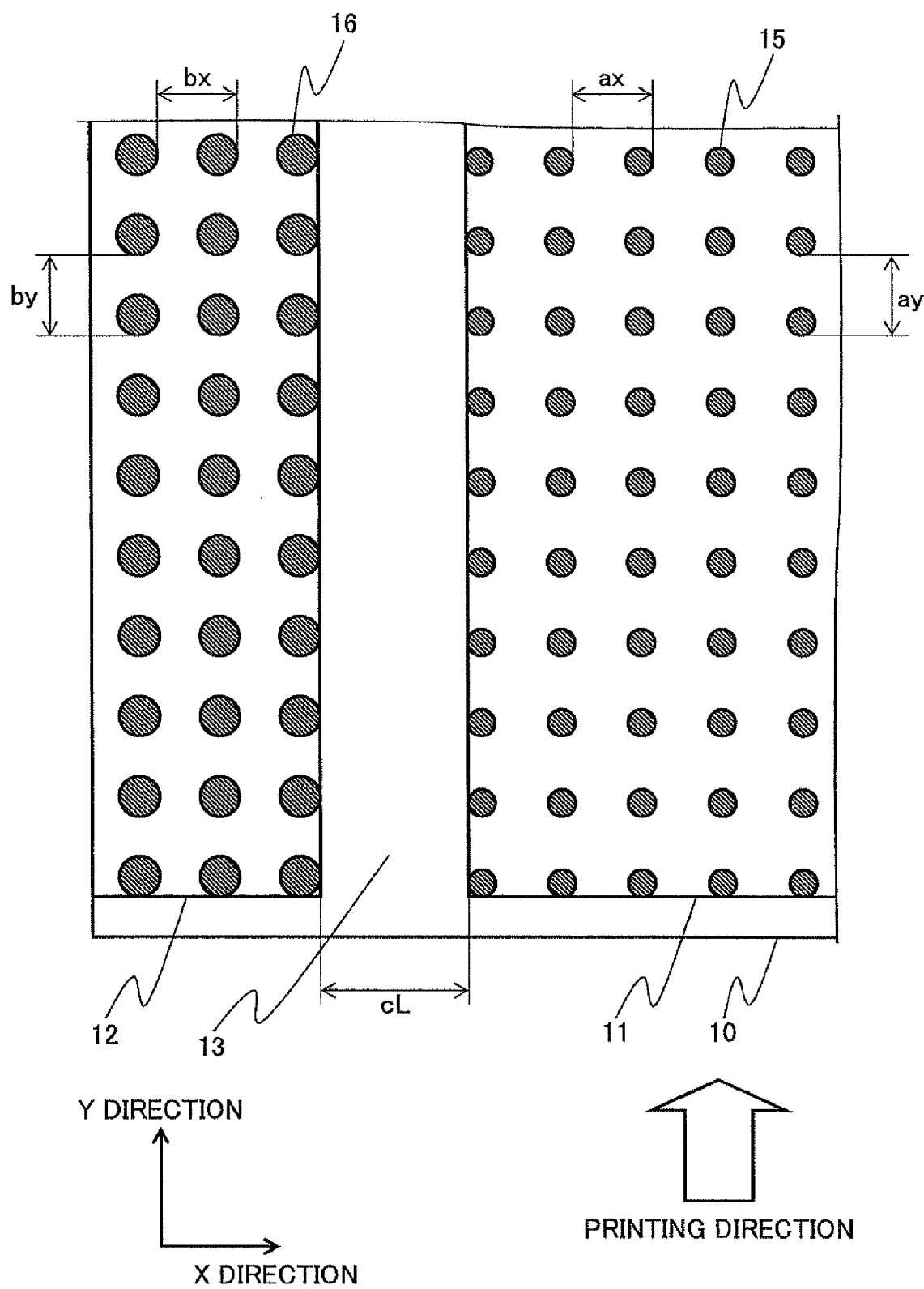
FIG. 14 is a pattern layout drawing of the screen plates according to examples 7 through 9 and comparative examples 4 and 5.

The screen mesh of the screen plate according to example 7 is composed of 500 plain-woven stainless steel wires per inch. As shown in FIG. 14, in the printing region 11 of the screen plate 10, the circular printing patterns 15 each having a diameter of 100 μm are formed. The printing patterns 15 are two-dimensionally arranged by 2500×2000 at the pattern pitch "ax" of 200 μm in the x-direction and the pattern pitch "ay" of 200 μm in the y-direction. Furthermore, in the dummy printing region 12 of the screen plate 10, the circular dummy printing patterns 16 each having a diameter of 150 μm are formed and two-dimensionally arranged by 3×2000 at the pattern pitch "bx" of 300 μm in the x-direction and the pattern pitch "by" of 200 μm in the y-direction. Furthermore, the full-surface printing region 13 of the screen plate 10 is formed into a belt shape having a width "cL" of 200 μm (one time as large as the pattern pitch "ax" between the printing patterns 15 in the x-direction).

Example 8

The screen mesh of the screen plate according to example 8 is composed of 500 plain-woven stainless steel wires per inch. As shown in FIG. 14, in the printing region 11 of the screen plate 10, the circular printing patterns 15 each having a diameter of 100 μm are formed. The printing patterns 15 are two-dimensionally arranged by 2500×2000 at the pattern pitch "ax" of 200 μm in the x-direction and the pattern pitch "ay" of 200 μm in the y-direction. Furthermore, in the dummy printing region 12 of the screen plate, the circular dummy printing patterns 16 each having a diameter of 150 μm are formed and two-dimensionally arranged by 3×2000 at the pattern pitch "bx" of 300 μm in the x-direction and the pattern pitch "by" of 200 μm in the y-direction. Furthermore, the full-surface surface printing region 13 of the screen plate 10 is formed into a belt shape having a width "cL" of 800 μm (four times as large as the pattern pitch "ax" between the printing patterns 15 in the x-direction).

Example 9

The screen mesh of the screen plate according to example 9 is composed of 500 plain-woven stainless steel wires per inch. As shown in FIG. 14, in the printing region 11 of the screen plate 10, the circular printing patterns 15 each having a diameter of 100 μm are formed. The printing patterns 15 are two-dimensionally arranged by 2500×2000 at the pattern pitch "ax" of 200 μm in the x-direction and the pattern pitch "ay" of 200 μm in the y-direction. Furthermore, in the dummy printing region 12 of the screen plate 10, the circular dummy printing patterns 16 each having a diameter of 150 μm are formed and two-dimensionally arranged by 3×2000 at the pattern pitch "bx" of 300 μm in the x-direction and the pattern pitch "by" of 200 μm in the y-direction. Furthermore, the full-surface printing region 13 is formed into a belt shape having a width "cL" of 3000 μm (15 times as large as the pattern pitch "ax" between the printing patterns 15 in the x-direction).

Comparative Example 4

The screen mesh of the screen plate according to comparative example 4 is composed of 500 plain-woven stainless steel wires per inch. As shown in FIG. 14, in the printing region 11 of the screen plate 10, the circular printing patterns 15 each having a diameter of 100 μm in the printing region 11 are formed. The printing patterns 15 are two-dimensionally arranged by 2500×2000 at the pattern pitch "ax" of 200 μm in the x-direction and the pattern pitch "ay" of 200 μm in the y-direction. Furthermore, in the dummy printing region 12 of the screen plate 10, the circular dummy printing patterns 16 each having a diameter of 150 μm are formed and two-dimensionally arranged by 3×2000 at the pattern pitch "bx" of 300 μm in the x-direction and the pattern pitch "by" of 200 μm in the y-direction. Furthermore, the full-surface printing region 13 of the screen plate 10 is formed into a belt shape having a width "cL" of 3200 μm (16 times as large as the pattern pitch "ax" between the printing patterns 15 in the x-direction).

Comparative Example 5

The screen mesh of the screen plate according to comparative example 5 is composed of 500 plain-woven stainless steel wires per inch. As shown in FIG. 14, in the printing region 11 of the screen plate 10, the circular printing patterns 15 each having a diameter of 100 μm are formed. The printing patterns 15 are two-dimensionally arranged by 2500×2000 at the pattern pitch "ax" of 200 μm in the x-direction and the pattern pitch "ay" of 200 μm in the y-direction. Furthermore, in the dummy printing region 12 of the screen plate 10, the circular dummy printing patterns 16 each having a diameter of 150 μm are formed and two-dimensionally arranged by 3×2000 at the pattern pitch "bx" of 300 μm in the x-direction and the pattern pitch "by" of 200 μm in the y-direction. Furthermore, the full-surface printing region 13 of the screen plate 10 is formed into a belt shape having a width "cL" of 4000 μm (20 times as large as the pattern pitch "ax" between the printing patterns 15 in the x-direction).

Table 1 shows the number of the defective printing patterns 15 formed in the printing region 11 and the number of the defective dummy printing patterns 16 formed in the dummy printing region 12 in examples 1 through 9 and comparative examples 1 through 5.

TABLE 1

| | PATTERN PITCHES ax AND ay BETWEEN PRINTING PATTERNS (μm) | PATTERN PITCH bx BETWEEN DUMMY PRINTING PATTERNS IN X-DIRECTION (μm) | PATTERN PITCH by BETWEEN DUMMY PRINTING PATTERNS IN Y-DIRECTION (μm) | SHAPE OF DUMMY PRINTING PATTERN | WIDTH cL OF ENTIRE PRINTING REGION PATTERN (μm) | THE NUMBER OF DEFECTIVE PRINTING PATTERNS IN PRINTING REGION | THE NUMBER OF DEFECTIVE DUMMY PRINTING PATTERNS IN DUMMY PRINTING REGION |
|---|---|---|---|---|---|---|---|
| EXAMPLE 1 | 300 | 300 | 300 | CIRCLE | 700 (2.3 TIMES) | NO | NO |
| COMPARATIVE EXAMPLE 1 | 300 | NO | NO | NO | NO | ABOUT 4000 | NO |
| EXAMPLE 2 | 300 | 300 | 300 | CIRCLE | 2100 (7 TIMES) | NO | NO |
| EXAMPLE 3 | 300 | 300 | 300 | CIRCLE | 4500 (15 TIMES) | NO | NO |
| COMPARATIVE EXAMPLE 2 | 300 | 300 | 300 | CIRCLE | 4800 (16 TIMES) | ABOUT 400 | ABOUT 20 |
| COMPARATIVE EXAMPLE 3 | 300 | 300 | 300 | CIRCLE | 9000 (30 TIMES) | ABOUT 2700 | ABOUT 400 |

TABLE 1-continued

| | PATTERN PITCHES ax AND ay BETWEEN PRINTING PATTERNS (μm) | PATTERN PITCH bx BETWEEN DUMMY PRINTING PATTERNS IN X-DIRECTION (μm) | PATTERN PITCH by BETWEEN DUMMY PRINTING PATTERNS IN Y-DIRECTION (μm) | SHAPE OF DUMMY PRINTING PATTERN | WIDTH cL OF ENTIRE PRINTING REGION PATTERN (μm) | THE NUMBER OF DEFECTIVE PRINTING PATTERNS IN PRINTING REGION | THE NUMBER OF DEFECTIVE DUMMY PRINTING PATTERNS IN DUMMY PRINTING REGION |
|---|---|---|---|---|---|---|---|
| EXAMPLE 4 | 300 | 400 | 300 | RHOMBUS | 700 (2.3 TIMES) | NO | NO |
| EXAMPLE 5 | 300 | 300 | — | BELT | 700 (2.3 TIMES) | NO | NO |
| EXAMPLE 6 | 300 | 300 | 300 | CIRCLE | 700 (2.3 TIMES) | NO | NO |
| EXAMPLE 7 | 200 | 300 | 200 | CIRCLE | 200 (ONE TIME) | NO | NO |
| EXAMPLE 8 | 200 | 300 | 200 | CIRCLE | 800 (4 TIMES) | NO | NO |
| EXAMPLE 9 | 200 | 300 | 200 | CIRCLE | 3000 (15 TIMES) | NO | NO |
| COMPARATIVE EXAMPLE 4 | 200 | 300 | 200 | CIRCLE | 3200 (16 TIMES) | ABOUT 2000 | NO |
| COMPARATIVE EXAMPLE 5 | 200 | 300 | 200 | CIRCLE | 4000 (20 TIMES) | ABOUT 4500 | ABOUT 600 |

Example 1 and comparative example 1 are different in the existence of the dummy printing region 12 and the full-surface printing region 13. In other words, in example 1, the screen printing was performed using the screen plate in which the dummy printing region 12 and the full-surface printing region 13 according to the present invention are formed. On the other hand, in comparative example 1, the screen printing was performed using the screen plate in which the dummy printing region 12 and the full-surface printing region 13 are not formed. As shown in table 1, no defective printing pattern 15 was formed in the printing region 11 in example 1, while about 4000 defective printing patterns were formed in the printing region 11 in comparative example 1.

Figure 15:
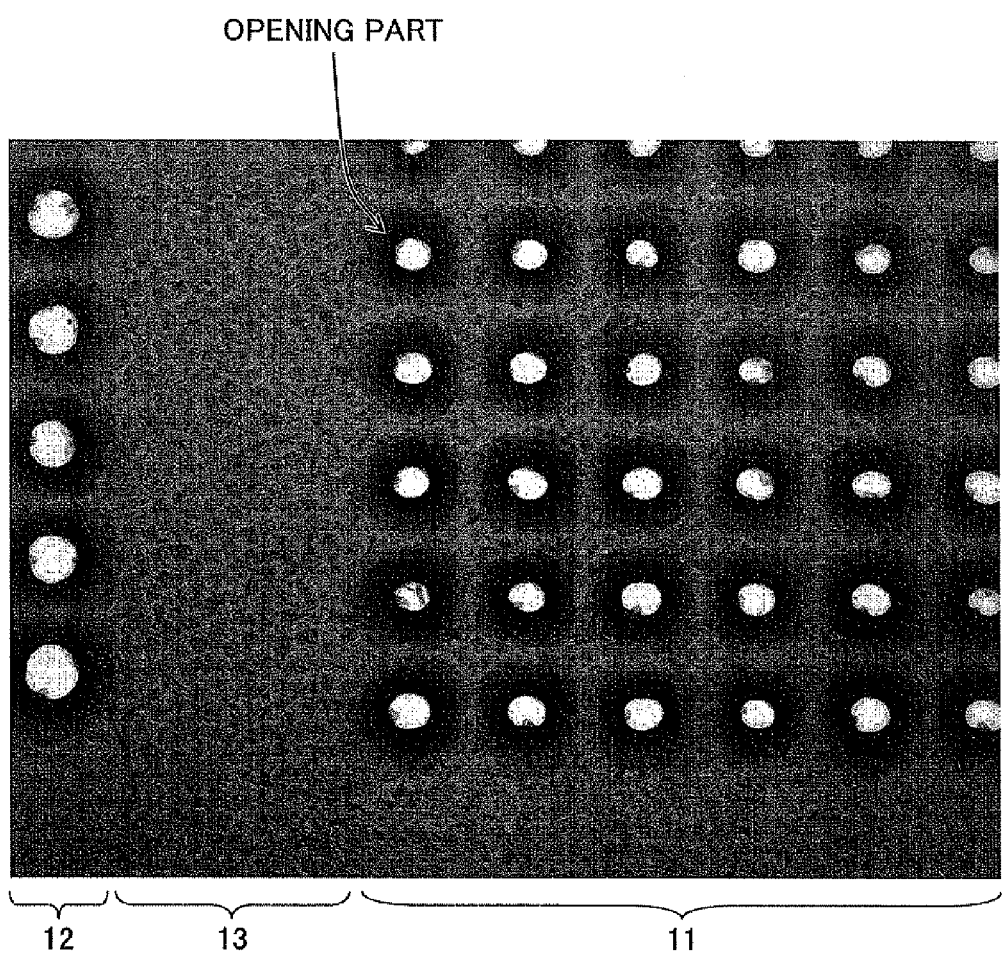
FIG. 15 is a microphotograph of printing patterns formed according to example 1.
Figure 16:
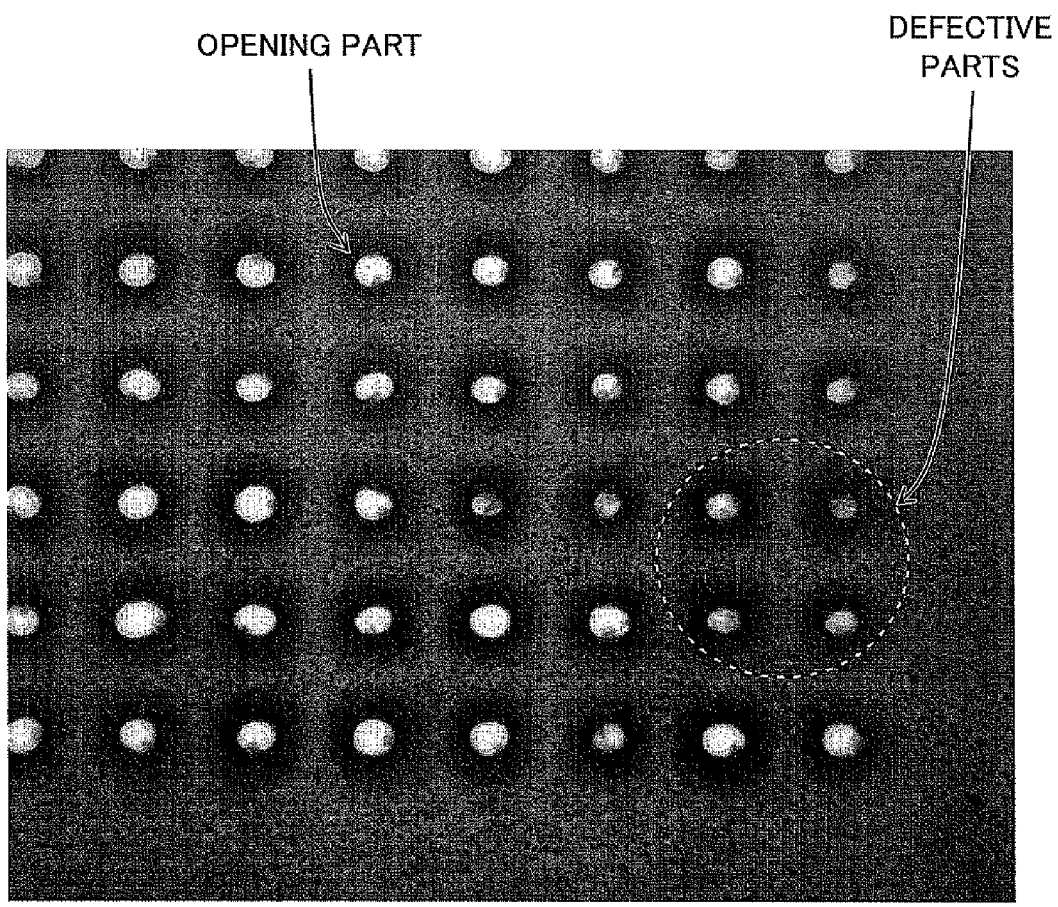
FIG. 16 is a microphotograph of printing patterns formed according to comparative example 1.

FIG. 15 shows a microphotograph of the printing patterns printed using the screen plate according to example 1, and FIG. 16 shows a microphotograph of the printing patterns printed using the screen plate according to comparative example 1. In example 1 shown in FIG. 15, the printing region 11 was formed at a distance away from the dummy printing region 12 through the full-surface printing region 13, and the insulating paste was entirely printed in the full-surface printing region 13. In the printing region 11 and the dummy printing region 12, no defective opening part was formed. On the other hand, in comparative example 1 shown in FIG. 16, defective opening parts were formed.

Furthermore, examples 2 and 3 and comparative examples 2 and 3 show dependency on the width of the full-surface printing region 13. In other words, in example 2, the screen printing was performed using the screen printing plate in which the width of the full-surface printing region 13 is 2100 μm (seven times as large as the pattern pitch between the printing patterns in the x-direction in the printing region 11). In example 3, the screen printing was performed using the screen printing plate in which the width of the full-surface printing region 13 is 4500 μm (15 times as large as the pattern pitch between the printing patterns in the x-direction in the printing region 11). In comparative example 2, the screen printing was performed using the screen printing plate in which the width of the full-surface printing region 13 is 4800 μm (16 times as large as the pattern pitch between the printing patterns in the x-direction in the printing region 11). In comparative example 3, the screen printing was performed using the screen printing plate in which the width of the full-surface printing region 13 is 9000 μm (30 times as large as the pattern pitch between the printing patterns in the x-direction in the printing region 11). As shown in table 1, no defective printing pattern 15 was formed in the printing region 11 in examples 2 and 3, while about 4000 defective printing patterns 15 were formed in the printing region 11 in comparative example 2 and about 2700 defective printing patterns 15 were formed in the printing region 11 in comparative example 3.

Furthermore, examples 4 and 5 show dependency when the shape of the dummy printing patterns 16 in the dummy printing region 12 is changed. In other words, in example 4, the screen printing was performed using the screen plate 10 in which the rhomboid dummy printing patterns 16 are formed in the dummy printing region 12 as shown in FIG. 13. In example 5, the screen printing was performed using the screen plate 10 in which the belt-shaped dummy printing patterns 17 are formed in the dummy printing region 12 as shown in FIG. 6. As shown in table 1, no defective printing pattern 15 was formed in the printing region 11 in examples 4 and 5 as in the case of example 1.

Furthermore, in example 6, the screen printing was performed using the screen plate 10 in which the dummy printing regions 12 and the full-surface printing regions 13 according to example 1 are provided on both sides of the printing region 11 as shown in FIG. 7. As shown in table 1, no defective printing pattern 15 was formed in the printing region 11 in example 6 as in the case of example 1.

Furthermore, examples 7, 8, and 9 and comparative examples 4 and 5 show dependency on the width "cL" of the full-surface printing region 13. Specifically, examples 7, 8, and 9 and comparative examples 4 and 5 show dependency on the width "cL" of the full-surface printing region 13 when the pattern pitch between the printing patterns 15 in the printing region 11 and the pattern pitch between the dummy printing patterns 16 in the dummy printing region 12 are made smaller than those in examples 1 through 3 and comparative examples 1 through 3. In other words, in example 7, the screen printing was performed using the screen printing plate in which the width "cL" of the full-surface printing region 13 is 200 μm (one time as large as the pattern pitch between the printing patterns in the x-direction in the printing region 11). In example 8, the screen printing was performed using the screen printing plate in which the width "cL" of the full-surface printing region 13 is 800 μm (four times as large as the pattern pitch between the printing patterns in the x-direction in the printing region 11). In example 9, the screen printing was performed using the screen printing plate in which the width "cL" of the full-surface printing region 13 is 3000 μm (15 times as large as the pattern pitch between the printing patterns in the x-direction in the printing region 11). In comparative example 4, the screen printing was performed using the screen printing plate in which the width "cL" of the full-surface printing region 13 is 3200 μm (16 times as large as the pattern pitch between the printing patterns in the x-direction in the printing region 11). In comparative example 5, the screen printing was performed using the screen printing plate in which the width "cL" of the full-surface printing region 13 is 4000 μm (20 times as large as the pattern pitch between the printing patterns in the x-direction in the printing region 11). As shown in table 1, no defective printing pattern 15 was formed in the printing region 11 in examples 7, 8, and 9, while about 2000 defective printing patterns 15 were formed in the printing region 11 in comparative example 4 and about 4500 defective printing patterns 15 were formed in the printing region 11 in comparative example 3.

The present invention is not limited to the specifically disclosed embodiments, and variations and modifications may be made without departing from the scope of the present invention.

The present application is based on Japanese Priority Application No. 2008-187655 filed on Jul. 18, 2008, with the Japan Patent Office, the entire contents of which are hereby incorporated by reference.

The invention claimed is:

1. A screen plate for printing two-dimensionally arranged opening patterns by screen printing, the screen plate comprising:
   a dummy printing region in which a predetermined pattern singly or plurally arranged along an edge part of one side or edge parts of two sides parallel to a printing direction of the screen plate;
   a full-surface solid printing region for performing full-surface solid printing, the full-surface solid printing region being formed into a band shape at a position closer to a central side of the screen plate than the dummy printing region; and
   a printing region that is formed at a position closer to the central side than the full-surface solid printing region and in which the opening patterns are two-dimensionally arranged.

2. The screen plate according to claim 1, wherein the full-surface solid printing region is formed parallel to the printing direction of the screen plate.

3. The screen plate according to claim 1, wherein a width of the full-surface solid printing region is greater than or equal to one time and less than or equal to 15 times as large as a pattern pitch between the opening patterns in the printing region.

4. The screen plate according to claim 1, wherein the predetermined pattern in the dummy printing region is a circular opening pattern having a diameter of greater than or equal to 20 μm or a polygonal opening pattern having a side of greater than or equal to 20 μm.

5. The screen plate according to claim 1, wherein the predetermined pattern in the dummy printing region is a band-shaped pattern having a width of greater than or equal to 20 μm that is arranged along the printing direction of the screen plate.

6. The screen plate according to claim 1, wherein an insulating paste is used for the screen printing.

7. The screen plate according to claim 1, wherein a screen mesh of the screen plate is composed of 360 through 800 stainless steel wires per inch, and a pattern pitch between the opening patterns in the printing region is in a range of 100 through 400 μm.

* * * * *